＃US008829685B2

United States Patent
Fukushima et al.

(10) Patent No.: US 8,829,685 B2
(45) Date of Patent: Sep. 9, 2014

(54) CIRCUIT DEVICE HAVING FUNNEL SHAPED LEAD AND METHOD FOR MANUFACTURING THE SAME

(75) Inventors: Tetsuya Fukushima, Fukaya (JP); Takashi Kitazawa, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 56 days.

(21) Appl. No.: 12/415,376

(22) Filed: Mar. 31, 2009

(65) Prior Publication Data

US 2010/0244209 A1  Sep. 30, 2010

(51) Int. Cl.
*H01L 23/48* (2006.01)
*H01L 23/52* (2006.01)
*H01L 29/40* (2006.01)
*H01L 23/00* (2006.01)
*H01L 23/495* (2006.01)
*H01L 21/56* (2006.01)
*H01L 23/31* (2006.01)

(52) U.S. Cl.
CPC ....... *H01L 23/49541* (2013.01); *H01L 2224/97* (2013.01); *H01L 2924/01322* (2013.01); *H01L 2924/01079* (2013.01); *H01L 2924/30105* (2013.01); *H01L 23/3107* (2013.01); *H01L 2224/48247* (2013.01); *H01L 24/97* (2013.01); *H01L 2224/32245* (2013.01); *H01L 24/48* (2013.01); *H01L 2924/01046* (2013.01); *H01L 2924/01033* (2013.01); *H01L 2924/01013* (2013.01); *H01L 21/568* (2013.01); *H01L 2224/73265* (2013.01); *H01L 2924/01005* (2013.01); *H01L 2224/48091* (2013.01); *H01L 2924/01029* (2013.01); *H01L 2924/01082* (2013.01); *H01L 2924/01078* (2013.01)

USPC ........... 257/775; 257/690; 257/692; 257/695; 257/773; 257/E23.06

(58) Field of Classification Search
CPC .................. H01L 2924/00; H01L 2224/73265; H01L 2924/00014; H01L 2224/48227; H01L 2224/48091; H01L 2924/01013; H01L 2924/30105; H01L 24/97; H01L 2924/01082; H01L 2224/97; H01L 2224/48247; H01L 2224/32245; H01L 24/48; H01L 23/3107; H01L 21/568; H01L 23/49541; H01L 2924/01029; H01L 2924/01322; H01L 2924/01033; H01L 2924/01079; H01L 2924/01078; H01L 2924/01005; H01L 2924/01046
USPC ......... 257/690, 772, 779, 692, 693, 773, 775, 257/730, 731, E23.056, E23.06, E23.061, 257/E23.066, E23.183, E23.184, E21.511, 257/666, 695
See application file for complete search history.

(56) References Cited

U.S. PATENT DOCUMENTS 4,048,438 A * 9/1977 Zimmerman .................. 174/254
4,543,544 A * 9/1985 Ziegner ............................ 333/34

(Continued)

FOREIGN PATENT DOCUMENTS

JP  60-206156  10/1985
JP  61237460 A * 10/1986 ............. H01L 23/48

(Continued)

*Primary Examiner* — Teresa M Arroyo
(74) *Attorney, Agent, or Firm* — Abel Law Group, LLP

(57) ABSTRACT

Provided are: a circuit device demonstrating an improved connection reliability while being mounted; and a method for manufacturing the same. The circuit device of the present invention includes: an island; leads arranged around the island, each lead having a lower surface and a side surface exposed to the outside; and a semiconductor element mounted on the island and electrically connected to the leads through thin metal wires. Furthermore, the exposed end portion of the lead is formed to spread toward the outside. By forming the lead in this manner, the area where the lead comes into contact with a brazing filler material is increased, thus improving the connection strength therebetween.

19 Claims, 10 Drawing Sheets

(56) References Cited

U.S. PATENT DOCUMENTS

| | | | |
|---|---|---|---|
| 4,920,074 A * | 4/1990 | Shimizu et al. | 29/827 |
| 5,036,381 A * | 7/1991 | Lin | 257/693 |
| 5,436,500 A * | 7/1995 | Park et al. | 257/696 |
| 5,466,966 A * | 11/1995 | Ito | 257/666 |
| 5,821,610 A * | 10/1998 | Nishikawa | 257/670 |
| 5,847,458 A * | 12/1998 | Nakamura et al. | 257/738 |
| 5,889,322 A * | 3/1999 | Hamada et al. | 257/701 |
| 6,246,107 B1 * | 6/2001 | Silvestre | 257/666 |
| 6,462,424 B1 * | 10/2002 | Seki et al. | 257/778 |
| 6,501,156 B1 * | 12/2002 | Nakanishi et al. | 257/666 |
| 6,501,352 B1 * | 12/2002 | Koriyama et al. | 333/260 |
| 6,696,749 B1 * | 2/2004 | Hung et al. | 257/669 |
| 6,700,186 B2 | 3/2004 | Yasunaga et al. | |
| 6,756,660 B2 * | 6/2004 | Yasunaga et al. | 257/666 |
| 6,790,711 B2 * | 9/2004 | Takahashi | 438/123 |
| 6,794,736 B1 * | 9/2004 | Kobayakawa | 257/666 |
| 6,885,076 B2 * | 4/2005 | Honda et al. | 257/433 |
| 6,921,682 B2 | 7/2005 | Janssen et al. | |
| 7,075,188 B2 * | 7/2006 | Kato et al. | 257/787 |
| 7,170,168 B2 * | 1/2007 | Wu et al. | 257/734 |
| 7,256,501 B2 * | 8/2007 | Okamoto et al. | 257/772 |
| 7,274,088 B2 * | 9/2007 | Wu et al. | 257/673 |
| 8,106,489 B1 * | 1/2012 | Gamboa et al. | 257/666 |
| 2001/0008305 A1 * | 7/2001 | McLellan et al. | 257/692 |
| 2001/0026014 A1 * | 10/2001 | Sakamoto et al. | 257/690 |
| 2003/0122225 A1 * | 7/2003 | Fukui et al. | 257/676 |
| 2004/0012078 A1 * | 1/2004 | Hortaleza | 257/678 |
| 2004/0169270 A1 * | 9/2004 | Shibata | 257/692 |
| 2004/0212059 A1 * | 10/2004 | Kato et al. | 257/678 |
| 2006/0049492 A1 * | 3/2006 | Holloway et al. | 257/666 |
| 2006/0220200 A1 * | 10/2006 | Yang | 257/678 |
| 2006/0231940 A1 * | 10/2006 | Doan | 257/686 |
| 2007/0126092 A1 * | 6/2007 | San Antonio et al. | 257/674 |
| 2008/0012100 A1 * | 1/2008 | Punzalan et al. | 257/666 |
| 2008/0205025 A1 * | 8/2008 | Spooner et al. | 361/813 |
| 2009/0267214 A1 * | 10/2009 | Kumazawa et al. | 257/690 |
| 2010/0123156 A1 * | 5/2010 | Seo et al. | 257/99 |
| 2010/0244210 A1 * | 9/2010 | Fukushima et al. | 257/670 |

FOREIGN PATENT DOCUMENTS

| | | | | |
|---|---|---|---|---|
| JP | 63033830 A * | 2/1988 | | H01L 21/56 |
| JP | 63-104457 | 5/1988 | | |
| JP | 01202853 A * | 8/1989 | | H01L 23/50 |
| JP | 04085952 A * | 3/1992 | | H01L 23/50 |
| JP | 2001-77232 | 3/2001 | | |
| JP | 2002-83918 A | 3/2002 | | |
| JP | 2002-344283 | 11/2002 | | |
| JP | 2004-172542 | 6/2004 | | |
| JP | 2004-200243 | 7/2004 | | |
| JP | 2004-349728 | 12/2004 | | |
| JP | 2006-165411 | 6/2006 | | |
| KR | 100160146 B1 | 8/1998 | | |

* cited by examiner

CIRCUIT DEVICE HAVING FUNNEL SHAPED LEAD AND METHOD FOR MANUFACTURING THE SAME

BACKGROUND OF THE INVENTION

1. Field of the Invention

The present invention relates to: a small circuit device in which a lead electrically connected to a circuit element built therein is exposed to the outside from a side surface of a sealing resin; and a method for manufacturing the same.

2. Description of the Related Art

The capacitance of semiconductor devices is increasing year after year, which in turn increases the number of lead terminals to work as various signal lines. Along with this trend, a semiconductor device with a quad flat package (QFP) with lead terminals extending in four directions and a semiconductor device with a quad flat non-leaded (QFN) package have been increasingly used. Meanwhile, small, thin and light semiconductor devices are demanded for use in cellular phones, portable computers, and the like. For this reason, there is a demand for downsizing of the mounting area for a semiconductor device, and a chip size package (CSP) is utilized to meet this demand. The CSP is a type of package mountable in an area equal to or slightly larger than its chip size by having leads exposed from the back surface of a resin sealed body.

As a conventional semiconductor-device manufacturing method in which a resin is molded in a resin-sealing die with a sealing sheet, there is a known technology in which: the sealing sheet is pasted on a lead frame at an entire surface opposed to the surface to which a semiconductor element is fixed; the lead frame pasted with the sealing sheet is placed in the resin-sealing die; and the resin is molded. This technology is described for instance in Japanese Patent Application Publication No. 2004-172542.

Hereinafter, the semiconductor-device manufacturing method will be described with reference to FIGS. 10 to 12. FIG. 10 is a cross-sectional view for describing a lead frame pasted with a sealing sheet. FIG. 11 is a cross-sectional view for describing a state where the lead frame is placed in a resin-sealing die. FIG. 12 is a cross-sectional view for describing a state after a resin package is formed.

Firstly, as shown in FIG. 10, multiple mount portions 111 are formed inside a lead frame 101, each mount portion 111 including at least a signal-connecting terminal 102 and a die pad 103 on which a semiconductor chip 104 is mounted. After a sealing sheet 106 is pasted on the back surface of the lead frame 101, the semiconductor chip 104 is bonded to the upper surface of the die pad 103 with an adhesive. Then, the semiconductor chip 104 bonded to the die pad 103 is electrically connected to the signal-connecting terminal 102 through a thin metal wire 105.

Subsequently, as shown in FIG. 11, the lead frame 101 which is pasted with the sealing sheet 106 and which is connected to the semiconductor chip 104 is placed in a cavity 109 of a resin-sealing die including an upper die 107 and a lower die 108. At this point, end portions of the lead frame 101 and of the sealing sheet 106 are held between the upper die 107 and the lower die 108, thereby forming the cavity 109. Then, although unillustrated, a sealing resin is injected into the resin-sealing die through a resin injection gate provided therein, and the resin is molded.

Thereafter, as shown in FIG. 12, the resin-sealing die is filled with the sealing resin, and a resin package 110 is formed. After that, the lead frame 101 in which the common resin package 110 is formed is taken out from the resin-sealing die. Then, although unillustrated, the common resin package 110 is cut off by dicing into the individual mount portions 111, and thus semiconductor devices are completed.

In the semiconductor device with the above-described configuration, the lower surface and a side surface of the signal-connecting terminal 102 are exposed to the outside. Solder is attached to this exposed portion of the signal-connecting terminal 102, and the semiconductor device is mounted thereon. However, if the semiconductor chip 104 having as many as several tens of electrodes is formed in a small package, the individual signal-connecting terminals 102 are down-sized. Accordingly, the area of each signal-connecting terminal 102 exposed to the outside is narrowed, which also reduces the area where the signal-connecting terminal 102 is in contact with a brazing filler material used for connection. This results in a problem of poor connection reliability in a semiconductor element mounted with the brazing filler material.

Furthermore, in the above-described method for manufacturing a semiconductor device, the signal-connecting terminal 102 of each mount portion 111 is integrally supported by a tie bar formed between two mount portions 111. However, if the width of each formed signal-connecting terminal 102 decreases along with the increase in the pin count of the semiconductor chip 104, it is difficult to ensure sufficient connection strength between the signal-connecting terminal 102 and the tie bar. This leads to a problem that the signal-connecting terminal 102 connected to the tie bar is deformed in the middle of the manufacturing process.

SUMMARY OF THE INVENTION

The present invention has been made in view of the above-described problems. A main object of the present invention is to provide a circuit device demonstrating improved connection reliability while being mounted, and to provide a method of manufacturing the circuit device.

A circuit device according to the present invention includes: a circuit element; a lead electrically connected to the circuit element and having a portion exposed to outside; and a sealing resin integrally covering the circuit element and the lead while a lower surface and a side surface of the lead are exposed to the outside. The lead is formed to spread from an inner side of the sealing resin toward a peripheral portion of the sealing resin.

A method for manufacturing a circuit device according to the present invention includes the steps of: preparing a lead frame in which units each including a plurality of leads electrically connected to a circuit element are arranged, in which the leads are connected to each other with tie bars surrounding each of the units, and in which a connection portion between the lead and the tie bar is formed wider than the other portions of the lead; disposing the circuit element on each of the units, and electrically connecting the circuit element to the leads; forming a sealing resin so as to cover the leads and the circuit element while back surfaces of the leads are exposed; and separating the sealing resin at a boundary between each adjacent two of the units, and removing each of the tie bars to thereby expose side surfaces of the leads from a side surface of the separated sealing resin.

DESCRIPTION OF THE INVENTIONS

Hereinafter, a circuit device and a method for manufacturing the same according to preferred embodiments of the present invention will be described with reference to the drawings.

Figure 1A:
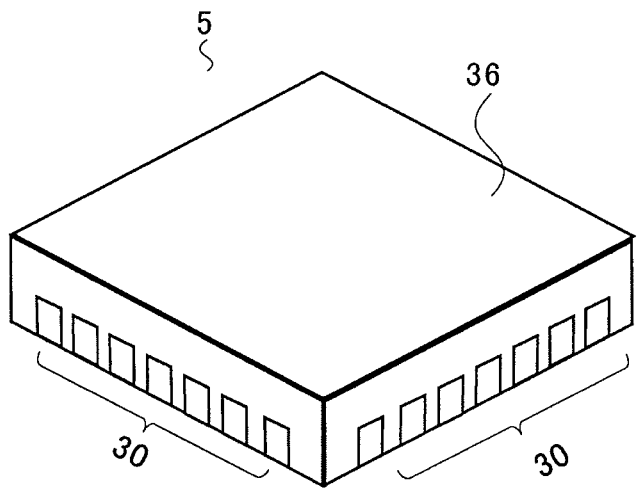
FIGS. 1A and 1B are perspective views.
Figure 1B:
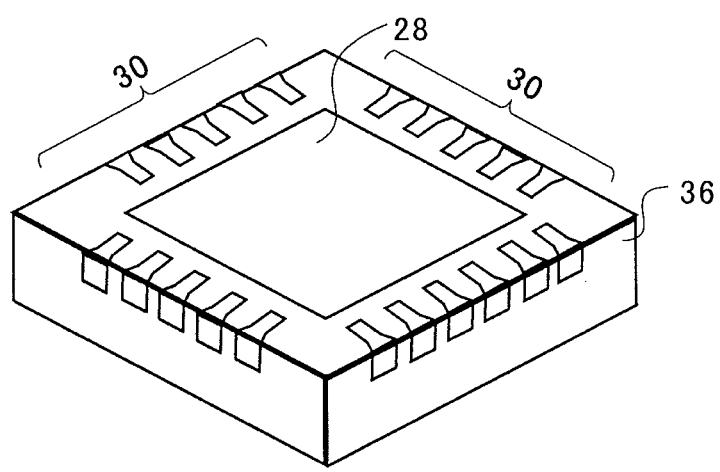

The configuration of a circuit device 5 of the preferred embodiment of the present invention will be described with reference to FIGS. 1A to 2B. FIG. 1A is a perspective view of the circuit device 5 in which a mounting surface is located at the bottom. FIG. 1B is a perspective view of the circuit device 5 in which the mounting surface is shown on top. FIG. 2A is a plan view as seen from the upper surface of the circuit device 5. FIG. 2B is a cross-sectional view showing a state where the circuit device 5 is mounted on a mounting board 8.

The external appearance of the circuit device 5 of this embodiment is a thin QFN hexahedron as shown in FIG. 1A. As one example of the specific size of the circuit device 5, the length, breadth and thickness are approximately 5 mm, 5 mm and 0.4 mm, respectively. Most of the outer surface of the circuit device 5 is formed of a sealing resin 36. End portions of leads 30 are exposed from the side surfaces of the sealing resin 36. Each side surface of the sealing resin 36 and the exposed surfaces of the leads 30 are positioned on the same plane.

As shown in FIG. 1B, an island 28 is exposed on a central portion of the upper surface (mounting surface) of the circuit device 5, and the multiple leads 30 are exposed at positions surrounding the island 28 from the four sides. The island 28 is a portion where a semiconductor element is mounted. The leads 30 are electrically connected to electrodes of the semiconductor element through thin metal wires.

In this embodiment, the multiple leads 30 are arranged in four peripheral portions of the circuit device 5, and the lower surface and the side surface of each lead 30 are together exposed to the outside. Thereby, when the circuit device 5 is mounted, solder can be welded to both the lower surface and the side surface of the lead 30. In this manner, the area where the lead 30 is in contact with the solder is increased, improving the connection reliability of the circuit device 5.

Figure 1C:
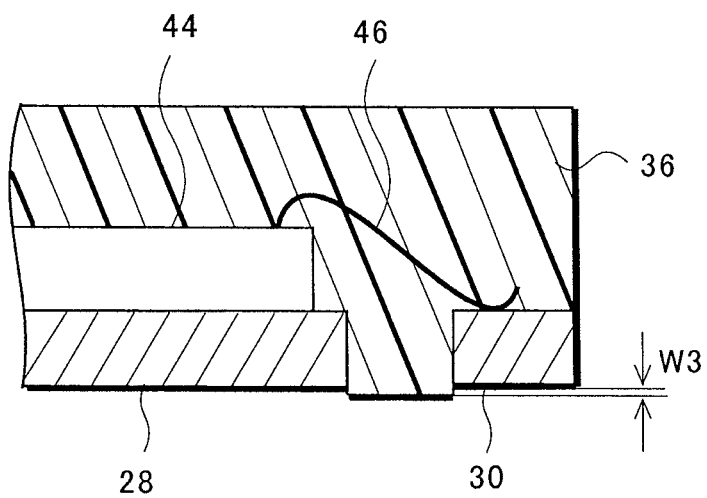
FIG. 1C is a cross-sectional view, showing a circuit device according to a preferred embodiment of the present invention.
Figure 2A:
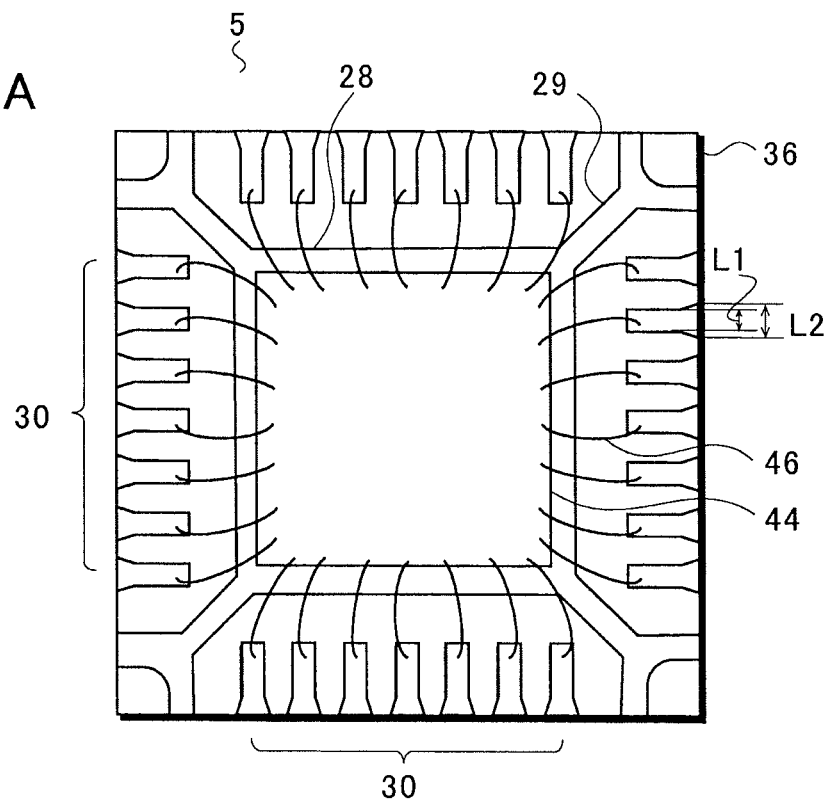
FIG. 2A is a plan view.
Figure 2B:
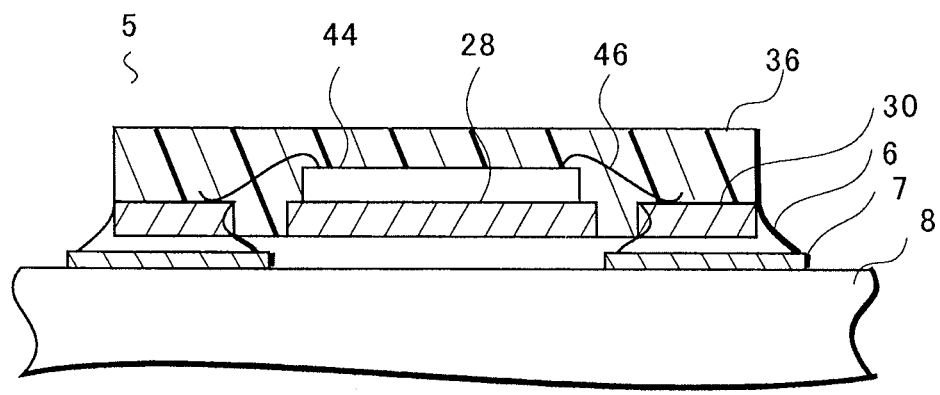
FIG. 2B is a cross-sectional view, showing the circuit device according to the preferred embodiment.

As shown in FIG. 1C, the lower surfaces of the island 28 and the lead 30 are exposed while being recessed inwardly (upwardly) from the lower surface of the sealing resin 36. An inwardly recessed distance W3 of each of the lower surfaces of the island 28 and the lead 30 from the lower surface of the sealing resin 36 is for example approximately 1 µm to 2 µm.

As shown in FIG. 2A, the island 28 is arranged near the central portion of the circuit device 5, and the multiple leads 30 are arranged so as to surround the island 28 while being apart from each other. A semiconductor element 44 is fixed to the upper surface of the island 28, and electrodes provided on the upper surface of the semiconductor element 44 are connected to the leads 30 through thin metal wires 46. Moreover, hanging leads 29 extend outwardly from four corners of the island 28. The hanging leads 29 are provided to support the island 28 in the middle of the manufacturing process.

As shown in FIG. 2B, the circuit device 5 with the above-described configuration is mounted on the upper surface of the mounting board 8. The mounting board 8 is a board made of, for example, a resin material such as a glass epoxy resin, a metal such as aluminium, or a ceramic. A conductive path 7 is formed on the upper surface of the mounting board 8 by patterning a metal such as copper foil into a predetermined shape. The circuit device 5 of this embodiment is fixed to the conductive path 7 formed on the upper surface mounting board 8 with a brazing filler material 6 (solder).

As the brazing filler material 6, lead eutectic solder or lead-free solder is employed. The brazing filler material 6 comes into contact with not only the lower surface of the lead 30 but also the side surface of the lead 30. In this manner, by bringing the brazing filler material 6 into contact with both the lower surface and side surface of the lead 30, the area where the brazing filler material 6 closely adheres to the lead 30 is increased, improving the connection strength therebetween. Furthermore, the brazing filler material 6 welded to the side surface of the lead 30 can be visually observed easily from the side of the circuit device 5, and thus the circumstance where the brazing filler material 6 is attached is easily checked.

In the circuit device 5 of this embodiment, the lead 30 is formed in a shape spreading toward the peripheral portion of the circuit device 5. As shown in FIG. 2A, most part of the lead 30 has a width L1 of 0.25 mm, whereas the end portion of the lead 30 thus formed in the spread shape has a width L2 of 0.3 mm. By forming the lead 30 in the shape spreading at the peripheral portion of the circuit device 5 as described above, the lower surface of the lead 30 has such a large width that the area where the lower surface of the lead 30 comes into contact with the brazing filler material 6 is increased in the peripheral portion of the circuit device 5. Furthermore, the area of the side surface of the lead 30 exposed to the outside is also increased in the peripheral portion of the circuit device 5, and thereby the area where the side surface of the lead 30 comes into contact with the brazing filler material 6 is increased, as well. As described above, the area where the lower surface and the side surface of the lead 30 are in contact with the brazing filler material 6 is increased, thus improving the connection reliability with brazing filler material 6.

Next, description will be given of a method for manufacturing a circuit device with the above-described configuration with reference to FIGS. 3A to 9B.

Figure 3A:
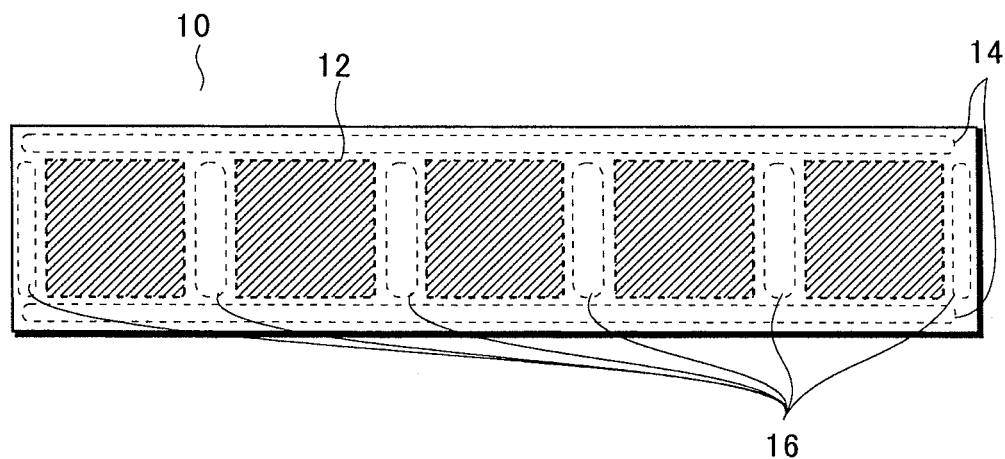
FIG. 3A is a plan view.
Figure 3B:
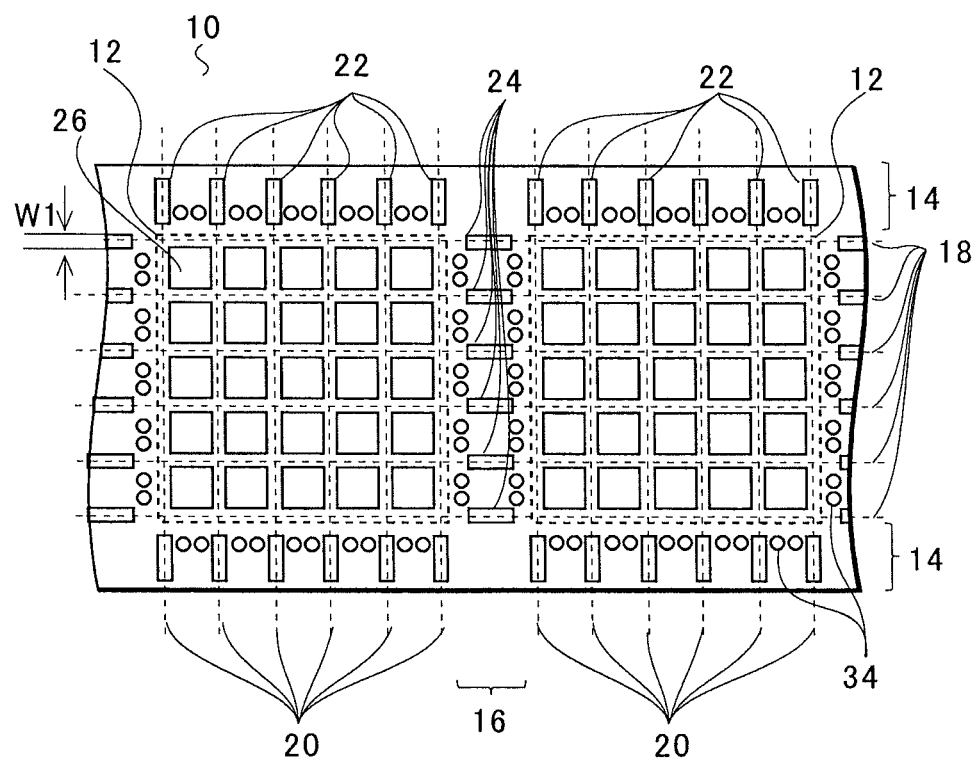
FIG. 3B is an enlarged plan view, showing a lead frame used in a method for manufacturing a circuit device according to a preferred embodiment of the present invention.
Figure 4:
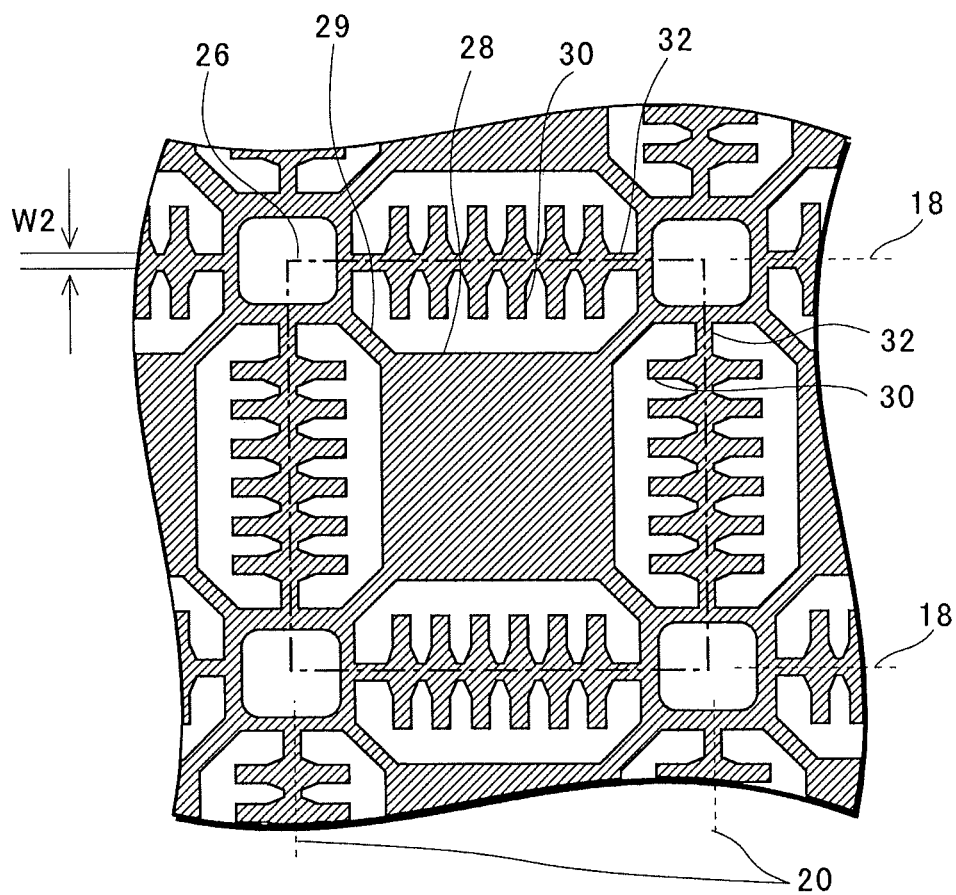
FIG. 4 is a plan view showing the lead frame used in the method for manufacturing a circuit device according to the preferred embodiment.

First of all, the configuration of a lead frame 10 used in the method of manufacturing the circuit device of this embodiment will be described with reference to FIGS. 3A to 4. Here, FIG. 3A is a plan view showing the entire lead frame 10. FIG. 3B is an enlarged plan view of blocks 12 arranged in the lead frame 10. FIG. 4 is a plan view showing the configuration of a unit included in the block 12.

As shown in FIG. 3A, the lead frame 10 is formed to have a predetermined shape by etching or punching conductive foil made of a metal such as copper having a thickness of approximately 0.2 mm, for example. The lead frame 10 has a strip-like shape with a planar size of length×breadth=60 mm×140 mm approximately. Furthermore, the top surface of the lead frame 10 is covered with a plating film formed by sequentially stacking, for example, nickel, palladium and gold in this order.

In the lead frame 10, a number of the blocks 12 are arranged apart from each other. Each block 12 is constituted of multiple units. Here, the five blocks 12 are arranged in line extending in a longitudinal direction of the lead frame 10. However, the number of the blocks 12 to be arranged may be one or may be plural such as six or more.

First supporters 14 and second supporters 16 are provided in peripheral portions of the blocks 12; i.e., remaining regions where no block 12 is being formed. These supporters form an outer frame supporting the entire lead frame 10. The first supporters 14 are positioned in the peripheral portions extending in the longitudinal direction of the lead frame 10 and opposing to each other. The second supporters 16 are positioned in the peripheral portions extending in a short side direction of the lead frame 10 and opposing to each other. Furthermore, second supporters 16 are provided each between the two adjacent blocks 12.

The configuration of the block 12 provided in the lead frame 10 will be described in detail with reference to FIG. 3B. Inside the block 12, multiple units 26 are arranged in a matrix pattern. Herein, the unit 26 is a unit element for constituting a single circuit device. As shown in this drawing, five units 26 are provided in one row and five units 26 are provided in one column; thus, a total of 5 rows×5 lines=25 units are provided in the single block 12. However, a larger number of the units 26 can be provided in the block 12.

In this drawing, dashed lines each show a dividing line defined between the two adjacent units 26 provided in the block 12. Here, since the units 26 are arranged in the matrix pattern, the dividing lines are defined in a lattice pattern. Dividing lines 20 are defined in a vertical direction of the drawing, while dividing lines 18 are defined in a lateral direction of the drawing.

The dividing lines 20 are defined, extending from the lower end of the lead frame 10 to the upper end thereof. This indicates that the lead frame 10 is cut off from the upper end to the lower end thereof along the dividing lines 20 in the manufacturing process of a circuit device.

The dividing lines 18 are continuously defined from the left end of the lead frame 10 to the right end thereof. This also indicates that the lead frame 10 is cut off from the left end to the right end thereof along the dividing lines 18 in the manufacturing process of a circuit device. Furthermore, the identical dividing lines 18 are defined on all the blocks 12 provided in the lead frame 10. In other words, when dicing is performed along the dividing lines 18 in the manufacturing process, the units 26 included in the plural blocks 12 can be separated at once.

In the preferred embodiment of the present invention, in order to facilitate the cutting-off of the lead frame 10 at positions corresponding to the aforementioned dividing lines 18 and 20, half grooves 22 and penetration grooves 24 are provided at equal intervals.

The half grooves 22 are formed by partially making each of the first supporters 14 thin at portions corresponding to the dividing lines 20. The half grooves 22 are formed thin by half-etching the first supporter 14 by, for example, approximately 0.1 mm. By forming the half grooves 22 at the positions where the dividing lines 20 are defined as described above, the first supporter 14 can be divided easily at these portions. Thus, the degree by which a dicing saw used in dicing wears is reduced. Furthermore, since the half grooves 22 do not penetrate the lead frame 10, the half grooves 22 thus provided reduce less the mechanical strength of the first supporter 14.

The penetration grooves 24 are portions formed by penetrating a part of the second supporter 16 in portions where the dividing lines 18 are defined. At the portions where the penetration grooves 24 are formed, no metal material constituting the lead frame 10 exists, and thus the units 26 are easily separated by dicing along the dividing lines 18. Furthermore, the degree by which the dicing saw used in dicing wears due to this dicing is also reduced.

In this embodiment, the penetration grooves 24 penetrating the lead frame 10 are provided in the second supporter 16 extending in the short side direction, while the half grooves 22 not penetrating the lead frame 10 but formed by making the lead frame 10 partially thin are provided in the first supporter 14 extending in the longitudinal direction. By providing the half grooves 22 in the first supporter 14 extending in the longitudinal direction, the mechanical strength of the first supporter 14 is maintained at a predetermined value or more. Accordingly, flexure or bending of the lead frame 10 is reduced in the middle of the manufacturing process. As to the second supporter 16 extending in the short side direction, the required mechanical strength is weak compared with that of the first supporter 14. This weak mechanical strength enables the formation of the penetration grooves 24 penetrating the lead frame 10 in order to facilitate the dicing.

Here, the half groove 22 and the penetration groove 24 each have a width W1 of, for example, approximately 0.5 mm to 1.0 mm.

Additionally, the half grooves 22 may be provided in both a portion of the first supporter 14 through which the dividing line 20 passes and a portion of the second supporter 16 through which the dividing line 18 passes. Furthermore, the penetration grooves 24 may be provided in both these portions.

Furthermore, in each of the first supporters 14 which are partitioned by the dividing lines 20, round penetration holes 34 penetrating the first supporter 14 are formed. Similarly, penetration holes 34 are formed in the second supporters 16. The penetration holes 34 are to improve the adhesion between the lead frame 10 and a sealing resin applied in the manufacturing process.

The configuration of a unit 26 included in the above-described block 12 will be described now with reference to FIG. 4. As described above, the unit 26 is a unit element for constituting a single circuit device. Here, the unit 26 is formed of: a single island 28; and multiple leads 30 arranged so as to surround the island 28 from the four sides.

Tie bars 32 are formed in a lattice pattern and each formed between the two adjacent units 26. To put it differently, each unit 26 is surrounded by the tie bars 32. A series of the leads 30 of each unit 26 extend inwardly of the unit 26 from the tie bars 32. Furthermore, the island 28 is connected to the tie bars 32 through hanging leads 29.

Moreover, the position of each tie bar 32 accurately corresponds to the dividing line 18 or 20 described with reference to FIG. 3B. Accordingly, when dicing is performed along the dividing lines 18, 20 in the manufacturing process, the tie bars 32 are removed.

Furthermore, the tie bars 32 are formed to be narrow to surely perform the aforementioned removal. The tie bar 32 has a width W2 of, for example, approximately 0.2 mm. Specifically, the tie bar 32 is formed so that the width W2 thereof can be narrower than the widths of the penetration groove 24 and the half groove 22 described with reference to FIG. 3B. Furthermore, the tie bar 32 is formed so that the width W2 thereof is narrower than the width of a dicing blade used in the manufacturing process.

Still furthermore, in this embodiment, the width of a portion of each lead 30 connected to the tie bar 32 is formed wider than that in the other portions of the lead 30. For example, the thickness of most part of the lead 30 is approximately 0.25 mm, whereas the thickness of the portion of the lead 30 connected to the tie bar 32 is approximately 0.3 mm. By making thicker the portion of the lead 30 connected to the tie bar 32 as described above, the strength of the portion of the lead 30 connected to tie bar 32 is improved. Thus, the bending of the lead 30 in the middle of the manufacturing process is reduced, thereby improving the quality of a manufactured circuit device.

In this respect, in order to simply improve the connection strength between each lead 30 and the tie bar 32, the lead 30 may be formed thick entirely. However, since a considerably small circuit device is manufactured in this embodiment, the leads 30 are arranged densely, and the leads 30 are separated from each other in a very short distance. For this reason, if the individual leads 30 are formed thick entirely in order to improve the connection strength between each lead 30 and the tie bar 32, the interval between the leads 30 is shortened. As a result, the leads 30 may contact each other, causing short-circuiting in some cases.

In order to avoid this problem, in this embodiment, the lead 30 is formed to widely spread at the portion where the lead 30 is in contact with the tie bar 32. In this manner, the leads 30 are prevented from coming into contact with each other, and furthermore the bending of the leads 30 is prevented in the middle of the manufacturing process.

Next, description will be given of a method for manufacturing a circuit device using a lead frame 10 with the above-described configuration with reference to FIGS. 5A to 9B.

Figure 5A:
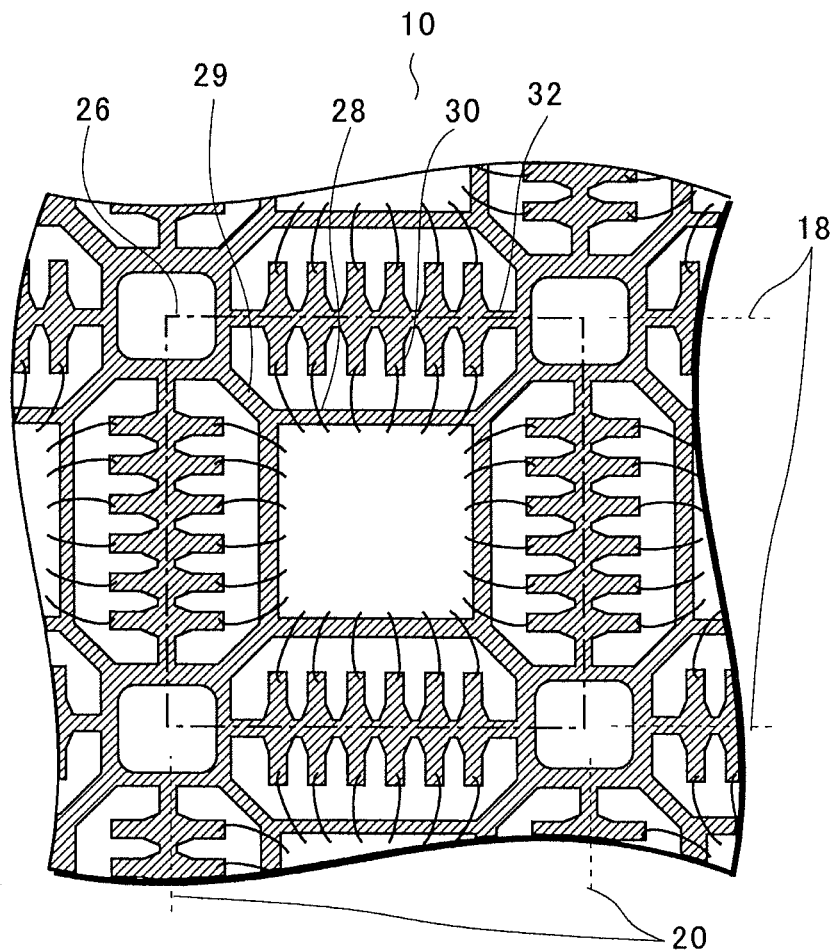
FIG. 5A is a plan view.
Figure 5B:
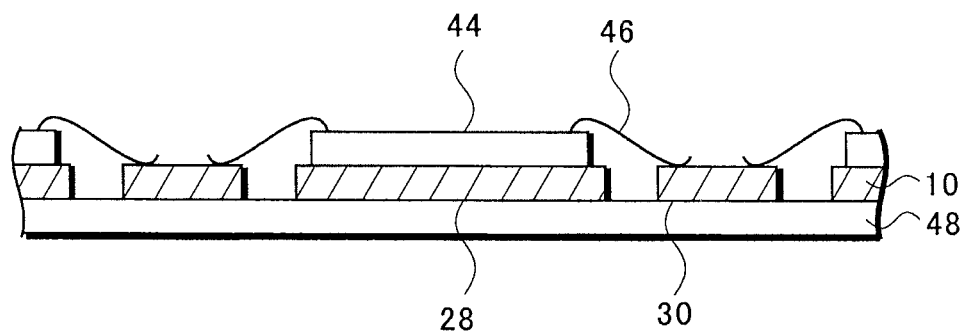
FIG. 5B is a cross-sectional view, for illustrating the method for manufacturing a circuit device according to the preferred embodiment.

Firstly, a semiconductor element 44 is fixed to a predetermined position of the lead frame 10 as shown in FIGS. 5A and 5B. FIG. 5A is a plan view showing a single unit 26. FIG. 5B is a cross-sectional view taken along the line B-B' in FIG. 5A.

In this step, the lead frame 10 with the configuration shown in FIGS. 3A and 3B is prepared by a punching or etching process. Then, the semiconductor element 44 is die-bonded and wire-bonded to each block 12 (see FIGS. 3A and 3B) in the lead frame 10. In this step, the die-bonding and the wire-bonding are performed, at once, on all the blocks 12 arranged in the lead frame 10 shown in FIGS. 3A and 3B.

As shown in FIG. 5A, firstly, the semiconductor element 44 is mounted on the upper surface of an island 28 with a conductive adhesive member such as solder or an insulating adhesive member such as an epoxy resin interposed therebetween. Subsequently, leads 30 are connected to electrodes provided on the upper surface of the semiconductor element 44 through thin metal wires 46.

In this step, the lower surface of the lead frame 10 is pasted on almost the entire upper surface of an adhesive sheet 48 as shown in FIG. 5B. The adhesive sheet 48 is a resin sheet, and an adhesive resin is applied on the upper surface of the sheet thinly. As the material of the adhesive sheet 48, for example, polyimide or polyethylene terephthalate (PET) is employed. The reason why the back surface of the lead frame 10 is pasted on the adhesive sheet 48 is to prevent a sealing resin from flowing around to the back surface of the lead frame 10 in the subsequent resin-sealing step.

As has been described, in this embodiment, the lead 30 is formed to have a width widely spreading at the connection portion between the lead 30 and the tie bar 32. Thereby, the tie bar 32 and the lead 30 are firmly connected. For this reason, when oscillation energy is applied by a bonding tool to the upper surface of the lead 30 in order to connect the thin metal wire 46 to the upper surface of the lead 30, the energy is preferably transmitted to the firmly supported lead 30. Consequently, the preferable close adhesion between the thin metal wire 46 and the lead 30 is obtained, improving the connection reliability therebetween.

Subsequently, as shown in FIGS. 6A to 7B, a sealing resin 36 is formed to cover the island 28, the lead 30, the thin metal wire 46 and the semiconductor element 44 shown in FIGS. 5A and 5B.

Figure 6A:
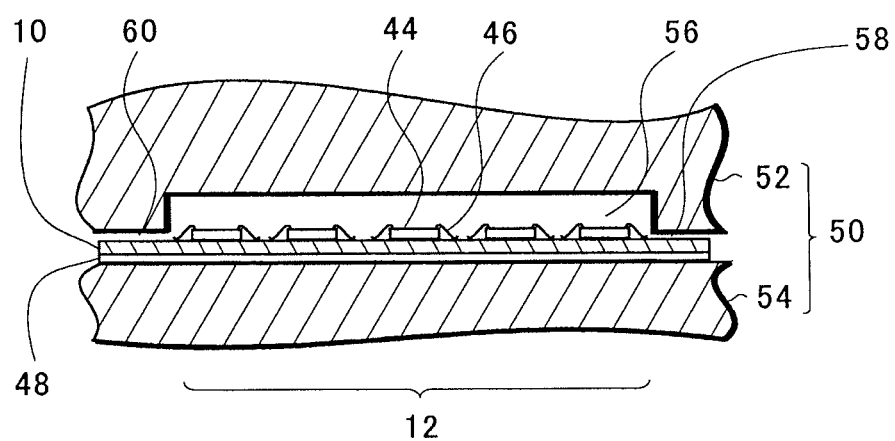
FIG. 6A is a cross-sectional view.

In this step, the resin sealing is performed using a mold die 50 including an upper die 52 and a lower die 54 as shown in FIG. 6A. In this step, transfer molding with a thermosetting resin such as an epoxy resin or injection molding with a thermoplastic resin such as polyethylene is employed.

In this step, the lead frame 10 pasted with the adhesive sheet 48 on the lower surface is disposed on the flat upper surface of the lower die 54, and abuts against the upper die 52 and the lower die 54. Thereby, each block 12 is accommodated in a single cavity 56 to perform the resin sealing.

The die 50 includes the upper die 52 and the lower die 54. The die 50 is provided with a gate 60 in a region corresponding to a peripheral portion of the block 12 and with an air vent 58 in a peripheral portion of the block 12 at the other side. The air vent 58 and the gate 60 oppose to each other. A liquid or semisolid sealing resin is injected into the cavity 56 through the gate 60. Then, air in the cavity 56 is released to the outside through the air vent 58. The amount of the released air corresponds to the injected amount of the sealing resin through the gate 60. The sealing resin 36 injected into the cavity 56 is cured by heating as necessary.

Moreover, in this step, the remaining portions (first supporters 14 and second supporters 16 shown in FIG. 3A) of the lead frame 10 around the blocks 12 are pressed by the upper die 52 and the lower die 54. Furthermore, in this step, the lower surface of the lead frame 10 is pasted on the adhesive sheet 48. Thus, even when the sealing resin is injected into the cavity 56 by a high pressure, the injected sealing resin is inhibited from flowing around to the lower surface of the lead. Note that, as shown in FIG. 5B, the lower surface of the lead frame 10 includes the lower surfaces of the island 28 and the leads 30 which are exposed to the outside as connection terminals. Accordingly, if the lower surface of the lead frame 10 is covered with the sealing resin, the sealing resin makes it difficult to connect the island 28 and the leads 30 to an external component. For this reason, the above-described adhesive sheet 48 is employed in this embodiment to prevent the sealing resin from flowing around to the lower surface of the lead frame 10. Thus, the lower surfaces of the island 28 and the leads 30 are preferably exposed to the outside.

Figure 6B:
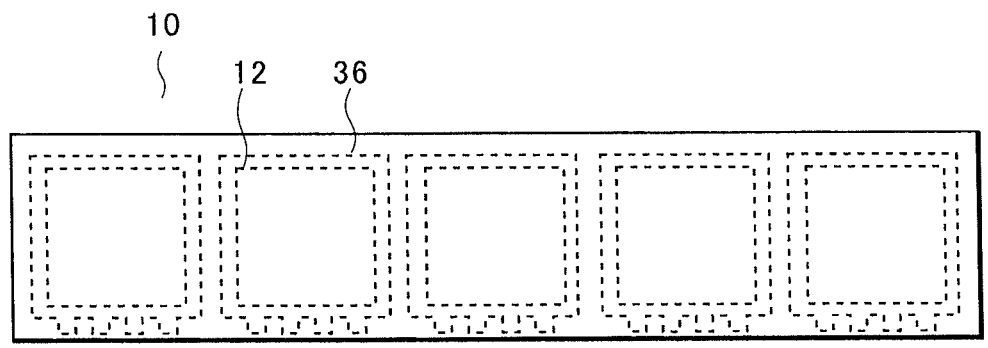
FIG. 6B is a plan view, for illustrating the method for manufacturing a circuit device according to the preferred embodiment.

FIG. 6B shows a cross-sectional view of the lead frame 10 after the above steps are completed. Here, the blocks 12 are individually sealed by the sealing resin 36.

Figure 7A:
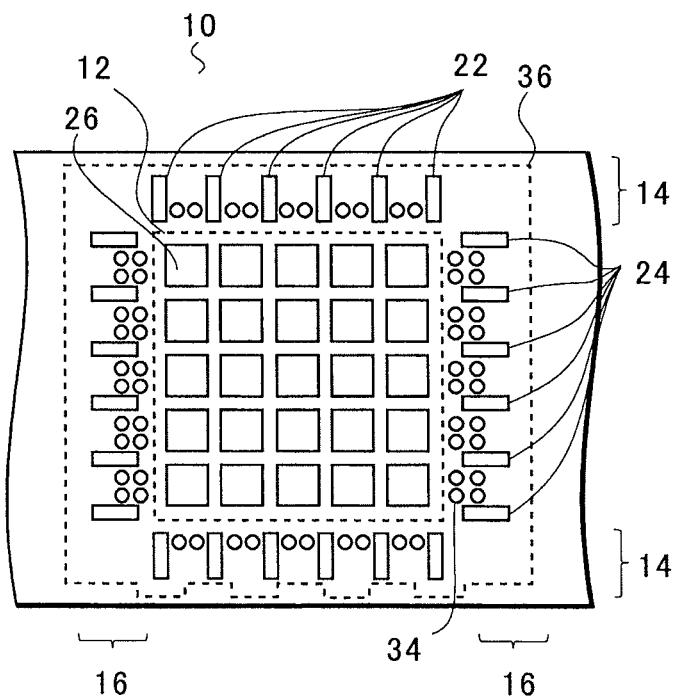
FIGS. 7A and 7B are plan views for illustrating the method for manufacturing a circuit device according to the preferred embodiment.
Figure 7B:
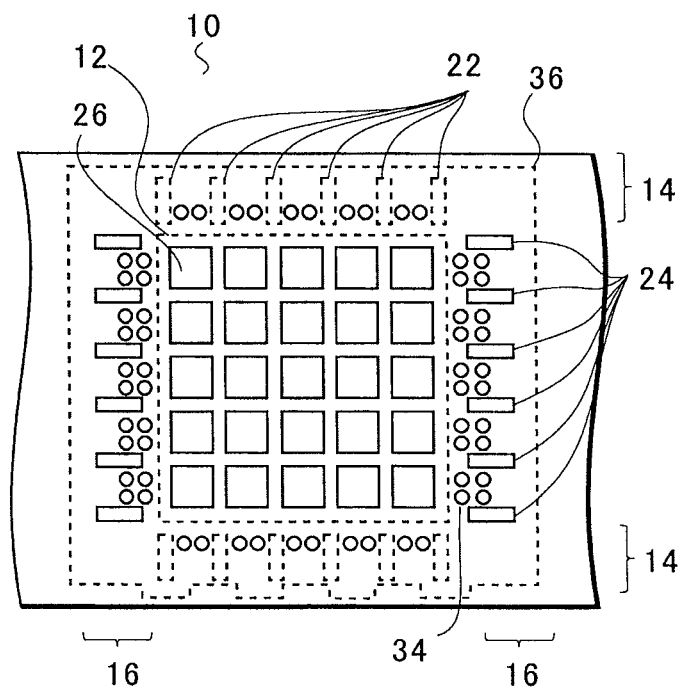

Description will be given of the details of the condition of each block 12 after the above-described resin-sealing step is completed with reference to FIGS. 7A and 7B. FIG. 7A is a plan view of the lead frame 10 as seen in a direction in which the sealing resin 36 is attached thereto. FIG. 7B is a plan view of the lead frame 10 as seen in the opposite direction.

As shown in FIG. 7A, the sealing resin 36 is formed to cover not only regions where the blocks 12 are formed but also the top surfaces of the first supporters 14 and the second supporters 16 in the peripheral portions of the blocks 12. In this manner, half grooves 22 and penetration grooves 24, which are provided respectively in the first supporters 14 and the second supporters 16 of the lead frame 10, are filled with the sealing resin 36. Furthermore, penetration holes 34 penetrating the first supporters 14 and the second supporters 16 are filled with the sealing resin 36.

As shown in FIG. 7B, the sealing resin 36 formed on the upper surface of the lead frame 10 is partially exposed from the back surface of the lead frame 10. Specifically, the sealing resin 36 filled in the penetration grooves 24 and the penetration holes 34 is exposed from the lower surface of the lead frame 10. On the other hand, since the half grooves 22 do not penetrate the lead frame 10, the sealing resin 36 filled in the half grooves 22 is not exposed from the lower surface of the lead frame 10.

Figure 8:
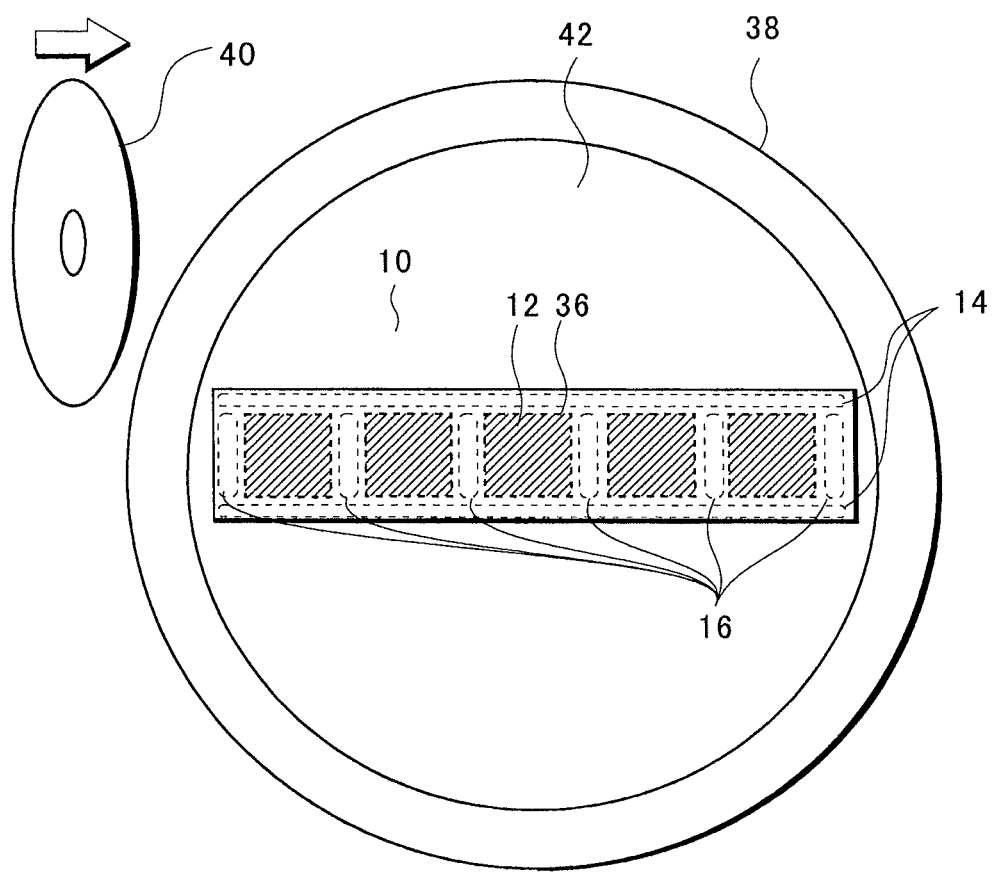
FIG. 8 is a plan view for illustrating the method for manufacturing a circuit device according to the preferred embodiment.
Figure 9A:
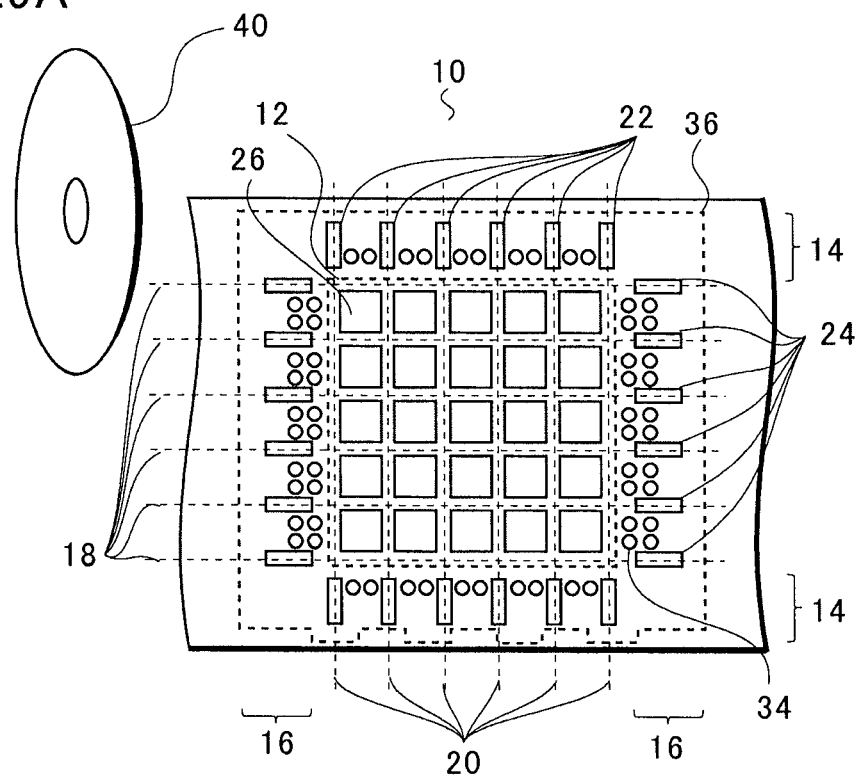
FIG. 9A is a plan view.
Figure 9B:
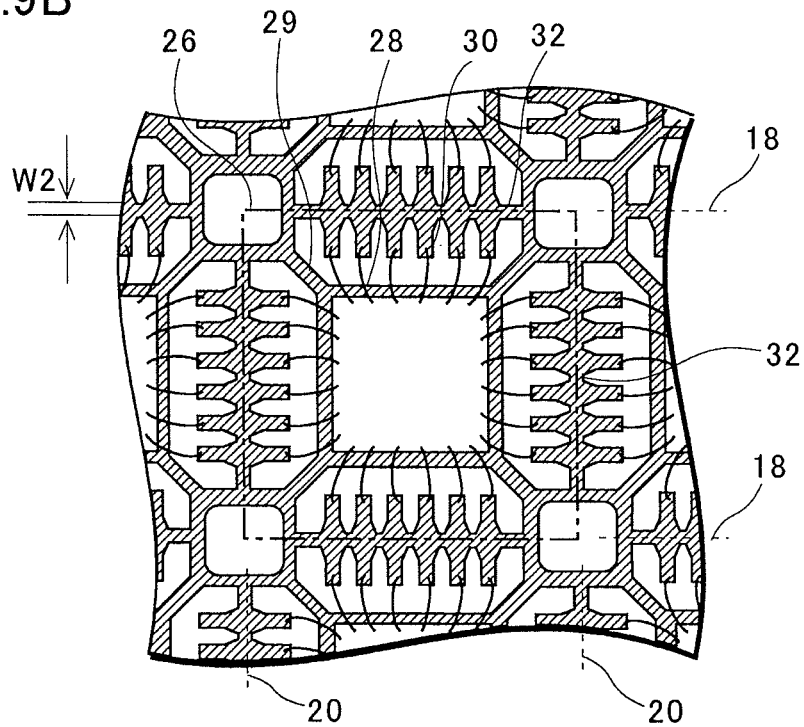
FIG. 9B is an enlarged plan view, for illustrating the method for manufacturing a circuit device according to the preferred embodiment.
Figure 10:
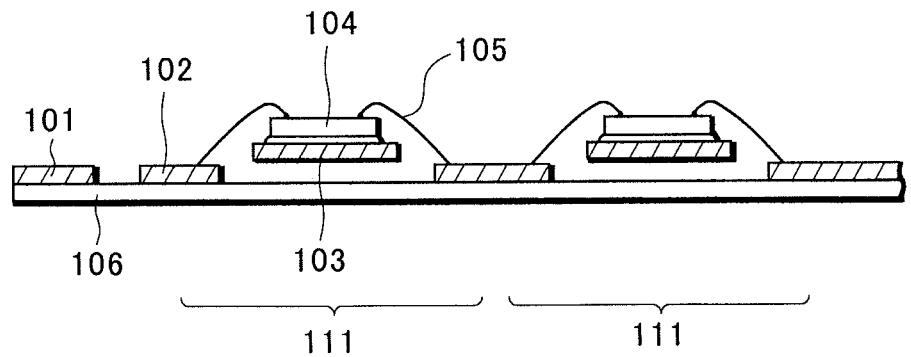
FIG. 10 is a cross-sectional view for illustrating a method for manufacturing a circuit device in a conventional art.
Figure 11:
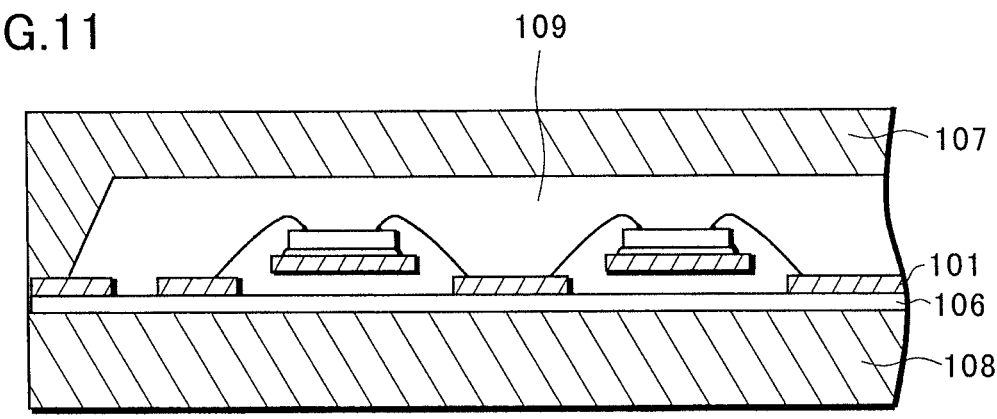
FIG. 11 is a cross-sectional view for illustrating the method for manufacturing a circuit device in the conventional art.
Figure 12:
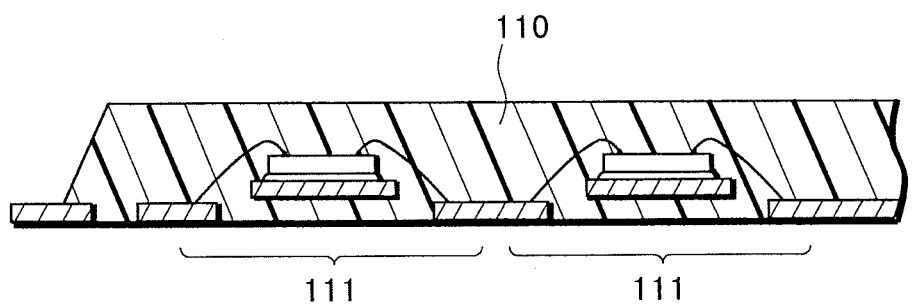
FIG. 12 is a cross-sectional view for illustrating the method for manufacturing a circuit device in the conventional art.

Subsequently, as shown in FIGS. 8 to 9B, the units in each block 12 are individually separated. FIG. 8 is a view for illustrating a dicing step. FIGS. 9A and 9B are views illustrating a state where the blocks 12 are individually separated.

In this step, firstly, the lead frame 10 having been subjected to the resin sealing is pasted on a dicing sheet 42 as shown in FIG. 8. The dicing sheet 42 is a resin sheet having an adhesive layer formed on the upper surface, and is supported by a metal frame 38 at the periphery. The metal frame 38 is an annularly-formed metal such as stainless steel.

The lead frame 10 is pasted on the upper surface of the dicing sheet 42 with the above-described configuration. Here, although the lower surface of the lead frame 10 has been pasted with the adhesive sheet 48 in the previous step (see FIG. 5B), this adhesive sheet 48 may be removed in advance, or may be pasted on the dicing sheet 42 together with the lead frame 10 without being removed. At this point, the surface of the lead frame 10 to be pasted on the dicing sheet 42 may be the surface where the sealing resin 36 is formed, or may be the opposite surface to the surface where the sealing resin 36 is formed.

After the lead frame 10 is pasted on the dicing sheet 42, each block 12 formed in the lead frame 10 is diced at once using a dicing blade 40 that rotates at a high speed. In this step, the sealing resin 36 on each block 12 is diced, and also a metal outer frame (supporters) of the lead frame 10 is divided by dicing.

The dicing in this step is performed down to a depth where the sealing resin 36 of each block 12 is completely separated from the lead frame 10.

Furthermore, in this step, the dicing performed in a lateral direction of the drawing separates all the blocks 12 formed in the lead frame 10 from each other in the lateral direction, and also divides the second supporters 16, which are the supporters extending in a short side direction of the lead frame 10. Furthermore, the dicing performed in a vertical direction of the drawing divides each block 12 in the vertical direction, and also divides the first supporters 14, which are the supporters extending in a longitudinal direction of the lead frame 10.

The details of the aforementioned dicing will be described with reference to FIGS. 9A and 9B. Firstly, the multiple units 26 are arranged in a matrix pattern in the single block 12 that is sealed as a single unit by the sealing resin 36. Dividing lines are defined in a lattice pattern and each defined between the two adjacent units 26. Here, dividing lines 18 are defined in the lateral direction of the drawing, while dividing lines 20 are defined in the vertical direction.

Furthermore, the penetration grooves 24 penetrating the second supporters 16 of the lead frame 10 are formed along the dividing lines 18. At the portions where the penetration grooves 24 are formed, a metal material constituting the lead frame 10 is removed, and only the sealing resin 36 exists. The metal material such as copper constituting the lead frame 10 is, here, a material harder to cut off than the sealing resin 36 constituted of an epoxy resin or the like. Thus, by providing the penetration grooves 24, the amount of the metal material cut off by the dicing blade 40 is reduced when the dicing is performed along the dividing lines 18. Thereby, the degree by which the dicing blade 40 wears due to the dicing is reduced.

Meanwhile, the half grooves 22 are formed along the dividing lines 20 that are defined in the vertical direction of the drawing. The half grooves 22 are formed by making the first supporters 14 of the lead frame 10 partially thin. Accordingly, the portions where the half grooves 22 are formed are in such a condition that the dicing with the dicing blade 40 can be performed more readily than the other regions of the first supporters 14. Thus, the provision of the half grooves 22 at the portions where the dividing lines 20 are defined reduces the degree by which the dicing blade 40 wears to separate the sealing resin 36 and the first supporters 14 along the dividing lines 20.

Furthermore, as shown in FIG. 9B, by performing the above-described dicing along the dividing lines 18 and 20, the tie bars 32 each locating between the two adjacent units 26 are removed. Thus, as the tie bars 32 are removed in this step, the units 26 are electrically separated from each other. Moreover, the leads 30 and the island 28 locating inside each unit 26 are electrically separated from those in the other units 26.

In this embodiment, as shown in FIG. 9B, each width W2 of the tie bars 32 locating at the positions where the dividing lines 18, 20 are defined is narrower than the width of the dicing blade 40 used in this step. Thus, by performing the dicing along the dividing lines 18, 20 using the dicing blade 40, the tie bars 32 are removed entirely. A structure where the spreading end portion of each lead 30 is exposed to the outside is obtained by performing the dicing of this step, After the above-described steps, a circuit device with the configuration shown in FIGS. 1A to 2B is manufactured.

According to the preferred embodiments of the present invention, the end portion of the lead is formed to spread toward the peripheral portion, increasing the area of the lead exposed to the outside from the sealing resin. Thus, when the circuit device is mounted, a relatively large amount of brazing filler material can be attached to the side surface of the lead exposed to the outside, improving the connection reliability between the circuit device and the external component.

Furthermore, according to the preferred embodiments of the present invention, the lead 30 is formed to have a wider width at the connection portion between the lead 30 and the tie bar 32 provided to support each unit 26 than that in the other portions of the lead 30, as shown in FIG. 4. Thereby, the mechanical strength of the connection portion between the lead 30 and the tie bar 32 is improved, thus preventing the deformation of the lead 30 in the middle of the manufacturing process.

What is claimed is:
1. A circuit device comprising:
a circuit element;
a lead electrically connected to the circuit element and having an inner side surface, an outer side surface, an upper surface and a lower surface; and a sealing resin covering the circuit element and the lead so that at least part of the lower surface and at least part of the outer side surface of the lead are exposed from the sealing resin and that the entire inner side surface and the entire upper surface of the lead are covered by the sealing resin, wherein a width of the lead is largest at the outer side surface of the lead in a plane parallel to the upper surface of the lead, the width of the lead in the parallel plane gradually increases toward the outer side surface of the lead having the largest width so as to produce a funnel-like shape, the funnel-like shape of the lead is contained in the sealing resin, and the lower surface of the lead is inwardly recessed from a lower surface of the sealing resin by 1 to 2 μm.

2. The circuit device according to claim 1, further comprising an island having a top surface and a bottom surface, wherein the circuit element is mounted on the top surface.

3. The circuit device according to claim 2, wherein an outer surface of the sealing resin is coplanar with the lower surface of the lead and the bottom surface of the island.

4. The circuit device according to claim 2, further comprising a plurality of hanging leads extending outward from and supporting the island.

5. The circuit device according to claim 1, further comprising a brazing filler material attached to the lower surface and the outer side surface of the lead exposed from the sealing resin.

6. The circuit device according to claim 5, wherein the brazing filler material comprises solder.

7. The circuit device according to claim 1, wherein the circuit element is a semiconductor element.

8. The circuit device according to claim 7, wherein a plurality of the leads are arranged to surround the semiconductor element, and are electrically connected to electrodes of the semiconductor element.

9. The circuit device according to claim 1, wherein the outer side surface of the lead having the largest width is flush with a surface of the sealing resin covering the lead.

10. A circuit device comprising:
a circuit element;
a lead electrically connected to the circuit element and having an inner side surface, an outer side surface, an upper surface and a lower surface;
a sealing resin covering the circuit element and the lead so that at least part of the lower surface and at least part of the outer side surface of the lead are exposed from the sealing resin and that the inner side surface and the upper surface of the lead are covered by the sealing resin; and
an island having a lower surface and a top surface on which the circuit element is mounted,
wherein a width of the lead is largest at the outer side surface of the lead in a plane parallel to the upper surface of the lead,
the width of the lead in the parallel plane gradually increases toward the outer side surface of the lead having the largest width so as to produce a funnel-like shape, and the lower surface of the lead and the island are inwardly recessed from a lower surface of the sealing resin is between the lower surface of the lead and the island, and the outer side surface of the lead having the largest width is flush with a surface of the sealing resin covering the lead.

11. The circuit device according to claim 10, wherein an outer surface of the sealing resin is coplanar with the lower surface of the lead and the bottom surface of the island.

12. The circuit device according to claim 10, further comprising a plurality of hanging leads extending outward from and supporting the island.

13. The circuit device according to claim 10, further comprising a brazing filler material attached to the lower surface and the outer side surface of the lead exposed from the sealing resin.

14. The circuit device according to claim 13, wherein the brazing filler material comprises solder.

15. The circuit device according to claim 10, wherein the circuit element is a semiconductor element.

16. The circuit device according to claim 15, wherein a plurality of the leads are arranged to surround the semiconductor element, and are electrically connected to electrodes of the semiconductor element.

17. The circuit device according to claim 10, wherein the outer side surface of the lead having the largest width is flush with a surface of the sealing resin covering the lead.

18. A circuit device comprising:
a semiconductor element;
a plurality of leads surrounding the semiconductor element and electrically connected to electrodes of the semiconductor element through metal wires, wherein each lead of the plurality of leads has an inner side surface, an outer side surface, an upper surface and a lower surface;
a sealing resin having a lower surface and covering the semiconductor element and the plurality of leads so that at least parts of the lower surfaces and at least parts of the outer side surfaces of the plurality of leads are exposed from the sealing resin and that the inner side surfaces and the upper surfaces of the plurality of leads are covered by the sealing resin; and
an island having a lower surface and a top surface on which the semiconductor element is mounted,
wherein for each lead within the plurality of leads, a width of the lead is largest at the outer side surface of the lead in a plane parallel to the upper surface of the lead, for each lead within the plurality of leads, the width of the lead in the parallel plane gradually increases toward the outer side surface of the lead having the largest width so as to produce a funnel-like shape, and the lower surfaces of the each of the plurality of leads and the island are inwardly recessed from the lower surface of the sealing resin, and the sealing resin is between the lower surfaces of the island and the plurality of leads.

19. The circuit device according to claim 18, further comprising a brazing filler material attached to the lower surfaces and the outer side surfaces of the plurality of leads exposed from the sealing resin.

* * * * *